(12) United States Patent
Hachiya et al.

(10) Patent No.: US 12,313,948 B2
(45) Date of Patent: May 27, 2025

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Atsushi Hachiya, Kameyama (JP); Hiroaki Furukawa, Kameyama (JP); Yuhichi Saitoh, Kameyama (JP); Kuniaki Okada, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/631,940

(22) Filed: Apr. 10, 2024

(65) Prior Publication Data

US 2024/0255822 A1    Aug. 1, 2024

Related U.S. Application Data

(63) Continuation of application No. 17/978,312, filed on Nov. 1, 2022, now Pat. No. 11,971,641.

(30) Foreign Application Priority Data

Nov. 22, 2021  (JP) ................................. 2021-189605

(51) Int. Cl.
  *G02F 1/1368*  (2006.01)
  *G02F 1/1333*  (2006.01)
  (Continued)

(52) U.S. Cl.
  CPC ...... *G02F 1/1368* (2013.01); *G02F 1/134309* (2013.01); *G02F 1/136286* (2013.01);
  (Continued)

(58) Field of Classification Search
  None
  See application file for complete search history.

(56) References Cited

U.S. PATENT DOCUMENTS 6,593,592 B1 *  7/2003  Yamazaki ......... H01L 29/78621
                                           257/E27.111
7,462,866 B2 *  12/2008  Yamazaki ......... H01L 29/78675
                                           438/149
(Continued)

FOREIGN PATENT DOCUMENTS

JP    2012-134475 A    7/2012
JP    2014-007399 A    1/2014
(Continued)

OTHER PUBLICATIONS

Non-Final Office Action issued on Aug. 31, 2023 for U.S. Appl. No. 17/978,312.

(Continued)

*Primary Examiner* — Ryan Crockett
(74) *Attorney, Agent, or Firm* — ScienBiziP, P.C.

(57) ABSTRACT

An active matrix substrate includes a first TFT disposed in each of pixel regions, a first flattened layer covering the first TFT, and a pixel electrode provided on the first flattened layer. The first TFT includes a lower gate electrode, a lower gate insulating layer, an oxide semiconductor layer, an upper gate insulating layer, and an upper gate electrode. The active matrix substrate further includes a first connection electrode for electrically connecting a drain contact region of the oxide semiconductor layer and the pixel electrode. The first flattened layer includes a pixel contact hole formed so as to expose a part of the first connection electrode. The bottom face of the pixel contact hole at least partially overlaps, of a lower gate metal layer including a lower gate electrode and an upper gate metal layer including an upper gate electrode, at least the lower gate metal layer when viewed from the normal direction of the substrate. The first connection electrode is formed from a transparent conductive material.

3 Claims, 12 Drawing Sheets

(51) Int. Cl.
    *G02F 1/1343* (2006.01)
    *G02F 1/1362* (2006.01)
    *H10D 86/40* (2025.01)
    *H10D 86/60* (2025.01)

(52) U.S. Cl.
    CPC ........... *H10D 86/441* (2025.01); *H10D 86/60* (2025.01); *G02F 1/133345* (2013.01); *G02F 1/133388* (2021.01); *G02F 1/13439* (2013.01); *G02F 2201/48* (2013.01); *G02F 2202/105* (2013.01); *G02F 2202/16* (2013.01)

(56) References Cited

U.S. PATENT DOCUMENTS

| | | | |
|---|---|---|---|
| 8,896,777 B2 * | 11/2014 | Yamazaki | H01L 29/78645 349/138 |
| 2012/0138922 A1 | 6/2012 | Yamazaki et al. | |
| 2013/0316535 A1 * | 11/2013 | Shin | H01L 23/485 438/682 |
| 2013/0320334 A1 | 12/2013 | Yamazaki et al. | |
| 2014/0286076 A1 | 9/2014 | Aoki et al. | |
| 2017/0338248 A1 * | 11/2017 | Park | H01L 29/66969 |
| 2020/0185425 A1 * | 6/2020 | Hara | G09F 9/30 |
| 2021/0351384 A1 * | 11/2021 | Lee | H10K 59/124 |
| 2022/0171246 A1 * | 6/2022 | Park | G02F 1/155 |
| 2022/0308378 A1 * | 9/2022 | Ozeki | G02F 1/1368 |
| 2023/0168550 A1 * | 6/2023 | Saitoh | G02F 1/134309 349/43 |

FOREIGN PATENT DOCUMENTS

| | | |
|---|---|---|
| JP | 2014-209727 A | 11/2014 |
| JP | 2017-187714 A | 10/2017 |

OTHER PUBLICATIONS

Notice of Allowance and Fees Due issued on Feb. 1, 2024 for U.S. Appl. No. 17/978,312.

* cited by examiner

ACTIVE MATRIX SUBSTRATE AND LIQUID CRYSTAL DISPLAY DEVICE

CROSS-REFERENCE TO RELATED APPLICATIONS

This application is a continuation of U.S. patent application Ser. No. 17/978,312, filed on Nov. 1, 2022, which claims the benefit of priority to Japanese Patent Application Number 2021-189605 filed on Nov. 22, 2021. The entire contents of the above-identified application are hereby incorporated by reference.

BACKGROUND

Technical Field

The disclosure relates to an active matrix substrate and a liquid crystal display device.

Currently, liquid crystal display devices including an active matrix substrate are widely used for a variety of purposes. The active matrix substrate includes a switching element for each pixel region. An active matrix substrate provided with a thin film transistor (TFT) as the switching element is referred to as a TFT substrate.

The TFT substrate includes a TFT and a pixel electrode that are provided for each pixel region, a gate wiring line that supplies a gate signal to the TFT, a source wiring line that supplies a source signal to the TFT, and the like. A gate electrode, a source electrode, and a drain electrode of the TFT are respectively electrically connected to the gate wiring line, the source wiring line, and the pixel electrode. The TFT is covered with an interlayer insulating layer.

A flattened layer (organic insulating film) for flattening the surface on the interlayer insulating layer may be formed. By forming the flattened layer, load capacitance (parasitic capacitance) can be reduced, and power consumption can be reduced. As a material for the flattened layer, a photosensitive resin material is used in many cases. When the flattened layer is formed, the pixel electrode is provided on the flattened layer and is connected to the drain electrode of the TFT in a contact hole formed in the flattened layer or the like.

SUMMARY

In order to obtain a sufficient flattening effect or a load capacitance reduction effect, the photosensitive resin material is thickly applied (for example, a thickness of several μm) when the flattened layer is formed. Thus, in order to form the contact hole so as to reliably expose a lower layer of the flattened layer, it is necessary to provide sufficient exposure energy to the photosensitive resin material during exposure to allow the photosensitive resin material to be sufficiently exposed in a depth direction. Specifically, by lengthening an exposure time or increasing the size of a mask pattern, the exposure is performed so as to more reliably expose a region to be removed by photolithography. Thus, in order to stably form the contact hole (so as to more reliably expose the lower layer), a finished diameter of the contact hole needs to be increased.

Since near the contact hole, the alignment state of liquid crystal molecules is disturbed and light leakage occurs, the contact hole causes reduction in contrast ratio and display quality. When a light blocking layer is provided to block light near the contact hole, the reduction in contrast ratio and display quality can be suppressed, but since an area contributing to the display in the pixel region is reduced by the light blocking layer, transmittance (usage efficiency of light) decreases. In a high-resolution (for example, 1000 ppi or greater) liquid crystal display device such as a liquid crystal display device for a head-mounted display, a rate occupied by the contact hole in the pixel region increases, and thus, a decrease in transmittance as described above becomes remarkable.

JP 2017-187714 A describes a configuration in which a contact hole formed in a flattened layer (organic insulating film) can be made shallow. In the configuration described in JP 2017-187714 A, an electrode (referred to as a "metal portion" in JP 2017-187714 A) that electrically connects a polysilicon semiconductor layer that is an active layer of a TFT and a pixel electrode is raised by a structure called a "pedestal portion" provided directly below the electrode, which makes it possible to make the contact hole formed in the flattened layer shallow.

However, when a complicated structure as described in JP 2017-187714 A is actually formed in a pixel, there is a concern about light leakage. Thus, it is considered that light blocking is required near the pedestal portion by using some kind of method. Thus, even when the configuration described in JP 2017-187714 A is used, it is difficult to greatly increase the transmittance (greatly improve the aperture ratio). Additionally, the addition of various processes for forming the pedestal portion results in an increase in process load, leading to the problem of manufacturing costs of a TFT substrate increasing.

The disclosure has been made in view of the above-described problems, and an object of the disclosure is to provide an active matrix substrate in which a decrease in transmittance caused by a contact hole formed in a flattened layer is suppressed.

The specification discloses an active matrix substrate and a liquid crystal display device described in the following items.

Item 1

An active matrix substrate provided with a display region defined by a plurality of pixel regions includes
a substrate,
a first TFT supported by the substrate and disposed on each of the plurality of pixel regions,
a first flattened layer covering the first TFT, and
a pixel electrode provided on the first flattened layer and electrically connected to the first TFT, in which
the first TFT includes
a lower gate electrode provided on the substrate,
a lower gate insulating layer covering the lower gate electrode,
an oxide semiconductor layer provided on the lower gate insulating layer, the oxide semiconductor layer including a channel region facing the lower gate electrode with the lower gate insulating layer interposed between the channel region and the lower gate electrode, and a source contact region and a drain contact region positioned respectively at both sides of the channel region,
an upper gate insulating layer provided on the channel region of the oxide semiconductor layer, and
an upper gate electrode provided on the upper gate insulating layer and facing the channel region of the oxide semiconductor layer with the upper gate insulating layer interposed between the channel region and the upper gate electrode, the active matrix substrate further includes
a first connection electrode configured to electrically
connect the drain contact region of the oxide semiconductor layer and the pixel electrode,
the first flattened layer includes a pixel contact hole formed exposing a part of the first connection electrode,
a bottom face of the pixel contact hole at least partially overlaps, of a lower gate metal layer including the lower gate electrode and an upper gate metal layer including the upper gate electrode, at least the lower gate metal layer when viewed from a normal direction of the substrate, and
the first connection electrode is formed from a transparent conductive material.

Item 2

In the active matrix substrate according to Item 1,
the bottom face of the pixel contact hole at least partially overlaps at least the lower gate electrode, of the lower gate electrode and the upper gate electrode, when viewed from the normal direction of the substrate.

Item 3

In the active matrix substrate according to item 1,
the lower gate metal layer includes a lower gate wiring line electrically connected to the lower gate electrode,
the upper gate metal layer includes an upper gate wiring line electrically connected to the upper gate electrode, and
the bottom face of the pixel contact hole at least partially overlaps at least the lower gate wiring line, of the lower gate wiring line and the upper gate wiring line, when viewed from the normal direction of the substrate.

Item 4

In the active matrix substrate according to item 1,
the bottom face of the pixel contact hole at least partially overlaps both the lower gate metal layer and the upper gate metal layer when viewed from the normal direction of the substrate.

Item 5

In the active matrix substrate according to item 4,
the bottom face of the pixel contact hole at least partially overlaps both the lower gate electrode and the upper gate electrode when viewed from the normal direction of the substrate.

Item 6

In the active matrix substrate according to item 4,
the lower gate metal layer includes a lower gate wiring line electrically connected to the lower gate electrode,
the upper gate metal layer includes an upper gate wiring line electrically connected to the upper gate electrode, and
the bottom face of the pixel contact hole at least partially overlaps both the lower gate wiring line and the upper gate wiring line when viewed from the normal direction of the substrate.

Item 7

In the active matrix substrate according to item 1,
an entirety of the bottom face of the pixel contact hole overlaps both the lower gate metal layer and the upper gate metal layer when viewed from the normal direction of the substrate.

Item 8

In the active matrix substrate according to item 7,
the entirety of the bottom face of the pixel contact hole overlaps both the lower gate electrode and the upper gate electrode when viewed from the normal direction of the substrate.

Item 9

In the active matrix substrate according to item 7,
the lower gate metal layer includes a lower gate wiring line electrically connected to the lower gate electrode,
the upper gate metal layer includes an upper gate wiring line electrically connected to the upper gate electrode, and
the entirety of the bottom face of the pixel contact hole overlaps both the lower gate wiring line and the upper gate wiring line when viewed from the normal direction of the substrate.

Item 10

In the active matrix substrate according to any one of items 1 to 9,
the first TFT includes a source electrode electrically connected to the source contact region, and
the bottom face of the pixel contact hole at least partially overlaps a source metal layer including the source electrode when viewed from the normal direction of the substrate.

Item 11

In the active matrix substrate according to item 10,
the source metal layer includes an island-shaped electrode separately provided from the source electrode, and
the bottom face of the pixel contact hole at least partially overlaps the island-shaped electrode when viewed from the normal direction of the substrate.

Item 12

In the active matrix substrate according to item 10,
the source metal layer includes a source wiring line electrically connected to the source electrode, and
the bottom face of the pixel contact hole at least partially overlaps the source wiring line when viewed from the normal direction of the substrate.

Item 13

In the active matrix substrate according to any one of Items 1 to 12,
a part of the first connection electrode is in contact with the drain contact region of the oxide semiconductor layer.

Item 14

In the active matrix substrate according to any one of items 1 to 13,
a part of the pixel electrode is in contact with the first connection electrode in the pixel contact hole.

Item 15

The active matrix substrate according to any one of items 1 to 13, further including
a second connection electrode formed from a transparent conductive material and electrically connecting the first connection electrode and the pixel electrode, the second connection electrode being in contact with the first connection electrode in the pixel contact hole, and
a second flattened layer formed filling the pixel contact hole and covering a part of the second connection electrode, in which
the pixel electrode is in contact with a portion of the second connection electrode not being covered by the second flattened layer, and
the pixel electrode includes a portion positioned on the second flattened layer.

Item 16

In the active matrix substrate according to item 15,
the second connection electrode and the pixel electrode are formed from an identical transparent conductive material.

Item 17

In the active matrix substrate according to item 16, the second connection electrode and the pixel electrode are formed from indium zinc oxide.

Item 18

The active matrix substrate according to any one of items 1 to 17, further including
a non-display region positioned in a periphery of the display region, and
a second TFT provided in the non-display region and supported by the substrate, the second TFT including a crystalline silicon semiconductor layer.

Item 19

In the active matrix substrate according to item 18,
the second TFT includes a gate electrode provided on an insulating layer covering the crystalline silicon semiconductor layer, the gate electrode facing the crystalline silicon semiconductor layer with the insulating layer interposed between the gate electrode and the crystalline silicon semiconductor layer, and
the gate electrode of the second TFT is formed in a layer identical to a layer of the lower gate electrode of the first TFT.

Item 20

In the active matrix substrate according to any one of items 1 to 19,
the oxide semiconductor layer includes an In—Ga—Zn—O based semiconductor.

Item 21

A liquid crystal display device includes
the active matrix substrate according to any one of items 1 to 20,
a counter substrate facing the active matrix substrate, and
a liquid crystal layer provided between the active matrix substrate and the counter substrate.

According to the embodiments of the disclosure, it is possible to provide an active matrix substrate in which a decrease in transmittance caused by a contact hole formed in a flattened layer is suppressed.

BRIEF DESCRIPTION OF DRAWINGS

The disclosure will be described with reference to the accompanying drawings, wherein like numbers reference like elements.

DESCRIPTION OF EMBODIMENTS

Hereinafter, embodiments of the disclosure will be described with reference to the accompanying drawings. In the embodiments of the disclosure, an active matrix substrate for a liquid crystal display device will be exemplified below, but the disclosure is not limited to the following embodiments.

First Embodiment

Figure 1:
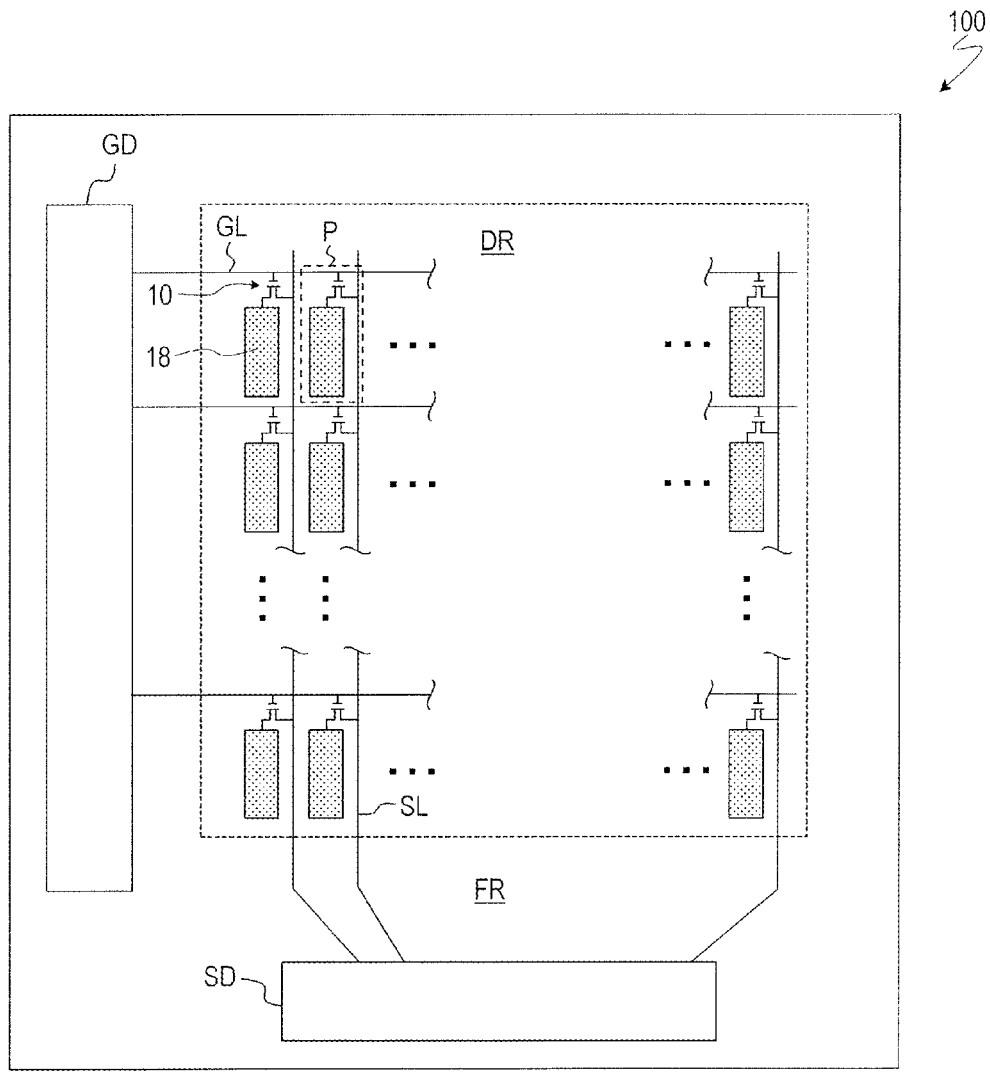
FIG. 1 is a schematic diagram illustrating an example of a planar structure of an active matrix substrate 100 according to an embodiment of the disclosure.

With reference to FIG. 1, an active matrix substrate 100 according to the present embodiment will be described. FIG. 1 is a schematic view illustrating an example of a planar structure of the active matrix substrate 100.

As illustrated in FIG. 1, the active matrix substrate 100 includes a display region DR, and a non-display region (also referred to as a "frame region") FR. The display region DR is defined by a plurality of pixel regions P. The plurality of pixel regions P are arrayed in a matrix shape including a plurality of rows and a plurality of columns. The pixel region P is a region corresponding to a pixel of a liquid crystal display device, and the pixel region P may be simply called a "pixel". The non-display region FR is a region positioned in a periphery of the display region DR and does not contribute to display.

In the display region DR, a plurality of gate wiring lines GL extending in a row direction, and a plurality of source wiring lines SL extending in a column direction are formed. Each pixel region P is, for example, a region surrounded by a pair of gate wiring lines GL adjacent to each other and a pair of source wiring lines SL adjacent to each other.

A peripheral circuit may be disposed in the non-display region FR. Here, in the non-display region FR, a gate driver GD that drives the gate wiring lines GL is integrally formed (monolithic), and a source driver SD that drives the source wiring lines SL is implemented. Note that, in the non-display region FR, a Source Shared Driving (SSD) circuit or the like that drives the source bus lines SL in a time-division manner may be further disposed, or the SSD circuit or the like may be integrally formed similarly to the gate driver GD.

A Thin Film Transistor (TFT) 10 and a pixel electrode 18 electrically connected to the TFT 10 are disposed in each pixel region P of the display region DR. The TFT 10 disposed in each pixel region P may be referred to as a "pixel TFT". The TFT 10 is supplied with a gate signal (scanning signal) from the corresponding gate wiring line GL, and is supplied with a source signal (display signal) from the corresponding source wiring line SL. Note that, in FIG. 1, for ease of explanation, only one gate wiring line GL is illustrated for each pixel row, but as will be described below, a lower gate wiring line and an upper gate wiring line may be provided for each pixel row, and each TFT 10 may be supplied with a gate signal from the lower gate wiring line and the upper gate wiring line.

Figure 2:
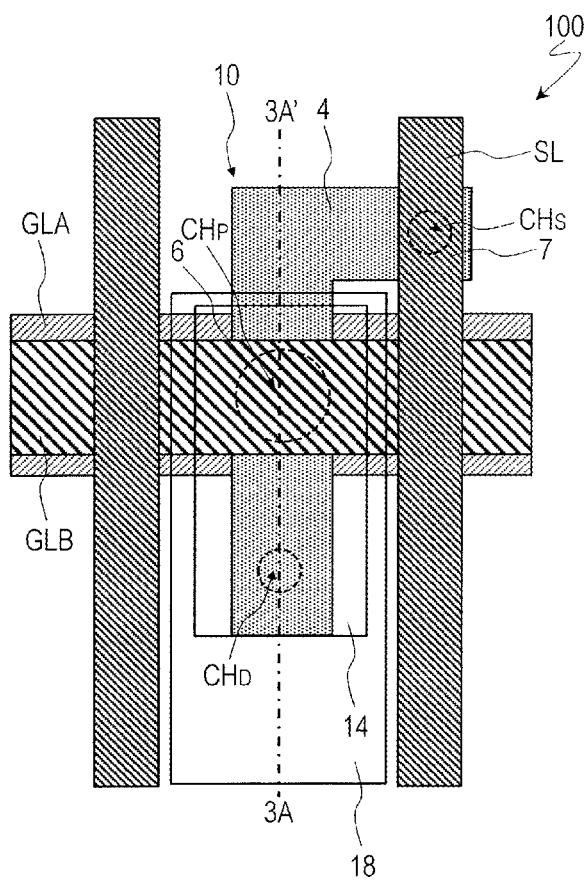
FIG. 2 is a plan view schematically illustrating the active matrix substrate 100.
Figure 3:
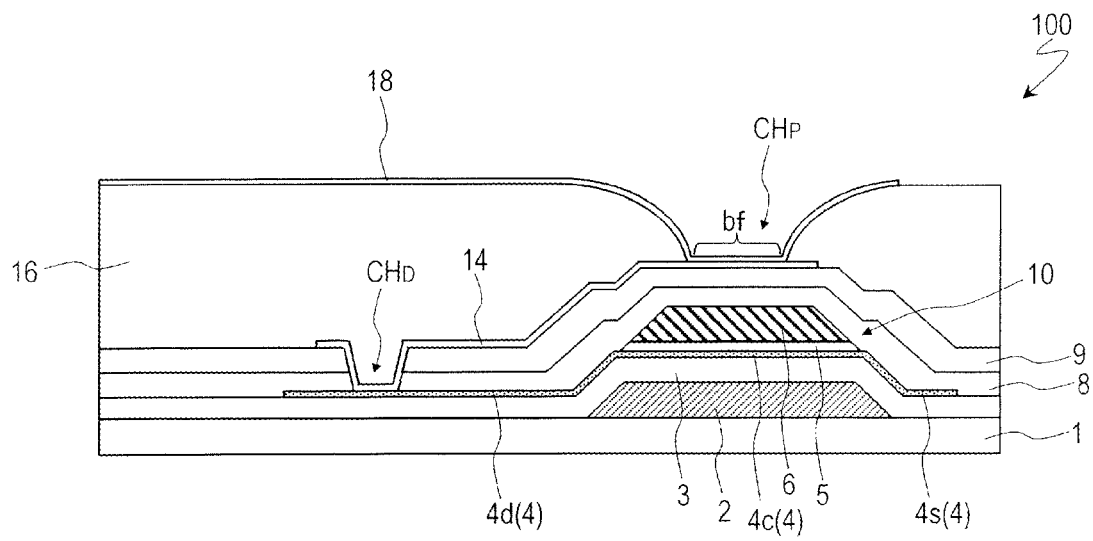
FIG. 3 is a cross-sectional view schematically illustrating the active matrix substrate 100 and illustrates a cross section taken along a line 3A-3A' in FIG. 2.

Hereinafter, with reference to FIG. 2 and FIG. 3, a more specific configuration of the active matrix substrate 100 will be described. FIG. 2 is a plan view schematically illustrating the active matrix substrate 100. FIG. 3 is a cross-sectional view schematically illustrating the active matrix substrate 100, and illustrates a cross section taken along a line 3A-3A' in FIG. 2.

As illustrated in FIG. 2 and FIG. 3, the active matrix substrate 100 includes a substrate 1, a TFT 10 supported by the substrate 1, a flattened layer 16 that covers the TFT 10, and a pixel electrode 18 provided on the flattened layer 16.

The substrate 1 is transparent and has an insulating property. The substrate 1 is, for example, a glass substrate or a plastic substrate.

The TFT 10 is disposed in each pixel region P. The TFT 10 includes a lower gate electrode 2, a lower gate insulating layer 3, an oxide semiconductor layer 4, an upper gate insulating layer 5, an upper gate electrode 6, and a source electrode 7. That is, the TFT 10 has a double gate structure.

The lower gate electrode 2 is provided on the substrate 1. The lower gate electrode 2 is electrically connected to the corresponding lower gate wiring line GLA. In the illustrated example, a part of the lower gate wiring line GLA (specifically, a portion facing the oxide semiconductor layer 4) functions as the lower gate electrode 2. In the present specification, the lower gate electrode 2 and a wiring line and/or an electrode formed in the same layer as that of the lower gate electrode 2 (by patterning an identical conductive film) are collectively referred to as a "lower gate metal layer". Here, the lower gate metal layer includes the lower gate electrode 2 and the lower gate wiring line GLA. The lower gate insulating layer 3 covers the lower gate electrode 2.

The oxide semiconductor layer 4 is provided on the lower gate insulating layer 3. The oxide semiconductor layer 4 includes a channel region 4c facing the lower gate electrode 2 with the lower gate insulating layer 3 interposed therebetween, and a source contact region 4s and a drain contact region 4d that are positioned respectively at both sides of the channel region 4c.

The upper gate insulating layer 5 is provided on the channel region 4c of the oxide semiconductor layer 4. The upper gate electrode 6 is provided on the upper gate insulating layer 5, and faces the channel region 4c of the oxide semiconductor layer 4 with the upper gate insulating layer 5 interposed therebetween. The upper gate electrode 6 is electrically connected to a corresponding upper gate wiring line GLB. In the illustrated example, a part of the upper gate wiring line GLB (specifically, a portion facing the oxide semiconductor layer 4) functions as the upper gate electrode 6. In the present specification, the upper gate electrode 6 and a wiring line and/or an electrode formed in the same layer as that of the upper gate electrode 6 (by patterning an identical conductive film) are collectively referred to as an "upper gate metal layer". Here, the upper gate metal layer includes the upper gate electrode 6 and the upper gate wiring line GLB. The upper gate electrode 6 may be supplied with the same potential as that of the lower gate electrode 2, or may be supplied with a different potential for threshold value control. When the upper gate electrode 6 and the lower gate electrode 2 are supplied with the same potential, the upper gate wiring line GLB and the lower gate wiring line GLA may be electrically connected. In addition, when the upper gate electrode 6 and the lower gate electrode 2 are supplied with the same potential, one among the upper gate electrode 6 and the lower gate electrode 2 may be an island-shaped electrode electrically connected to the other.

A first interlayer insulating layer 8 is provided so as to cover the upper gate electrode 6 and the oxide semiconductor layer 4. The source electrode 7 is provided on the first interlayer insulating layer 8. A source contact hole $CH_S$ is formed in the first interlayer insulating layer 8 so as to expose a part of the source contact region 4s of the oxide semiconductor layer 4. The source electrode 7 is in contact with the source contact region 4s in the source contact hole and is electrically connected to the source contact region 4s. The source electrode 7 is electrically connected to the corresponding source wiring line SL. In the illustrated example, a part of the source wiring line SL (specifically, a portion facing the oxide semiconductor layer 4) functions as the source electrode 7. In the present specification, the source electrode 7 and a wiring line and/or an electrode formed in the same layer as that of the source electrode 7 (by patterning an identical conductive film) are collectively referred to as a "source metal layer". Here, the source metal layer includes the source electrode 7 and the source wiring line SL.

A second interlayer insulating layer 9 is provided so as to cover the TFT 10, and the flattened layer 16 is formed on the second interlayer insulating layer 9. The flattened layer 16 is formed from, for example, a photosensitive resin material. The pixel electrode 18 is provided on the flattened layer 16. The pixel electrode 18 is electrically connected to the TFT 10.

The exemplified active matrix substrate 100 is used in a Fringe Field Switching (FFS) mode liquid crystal display device, and although not illustrated here, a dielectric layer provided so as to cover the pixel electrode 18 and a common electrode that is provided on the dielectric layer and that faces the pixel electrode 18 are further provided therein. At least one slit is formed in the common electrode for each pixel region P.

The active matrix substrate 100 further includes a connection electrode 14 for electrically connecting the drain contact region 4d of the oxide semiconductor layer 4 and the pixel electrode 18. The connection electrode 14 is formed from a transparent conductive material, and is provided on the second interlayer insulating layer 9. In the first interlayer insulating layer 8 and the second interlayer insulating layer 9, a drain contact hole $CH_D$ is formed so as to expose a part of the drain contact region 4d of the oxide semiconductor layer 4. A part of the connection electrode 14 is in contact with the drain contact region 4d in the drain contact hole $CH_D$.

The flattened layer 16 includes a pixel contact hole $CH_P$ formed so as to expose a part of the connection electrode 14. A part of the pixel electrode 18 is in contact with the connection electrode 14 in the pixel contact hole $CH_P$.

When viewed from the normal direction of the substrate 1, a bottom face bf of the pixel contact hole $CH_P$ at least partially overlaps both the lower gate metal layer and the upper gate metal layer. More specifically, the bottom face bf of the pixel contact hole $CH_P$ at least partially overlaps both the lower gate electrode 2 and the upper gate electrode 6. In the illustrated example, the entirety of the bottom face bf of the pixel contact hole $CH_P$ overlaps both the lower gate metal layer and the upper gate metal layer, more specifically, both the lower gate electrode 2 and the upper gate electrode 6.

As described above, in the active matrix substrate 100 according to the present embodiment, the bottom face bf of the pixel contact hole $CH_P$ formed in the flattened layer 16 at least partially overlaps both the lower gate electrode 2 and the upper gate electrode 6. Also, the connection electrode 14 for electrically connecting the drain contact region 4d of the oxide semiconductor layer 4 and the pixel electrode 18 is formed from a transparent conductive material. The fact that the active matrix substrate 100 has such a configuration can improve the transmittance thereof. The reasons for this will be described below.

Figure 4:
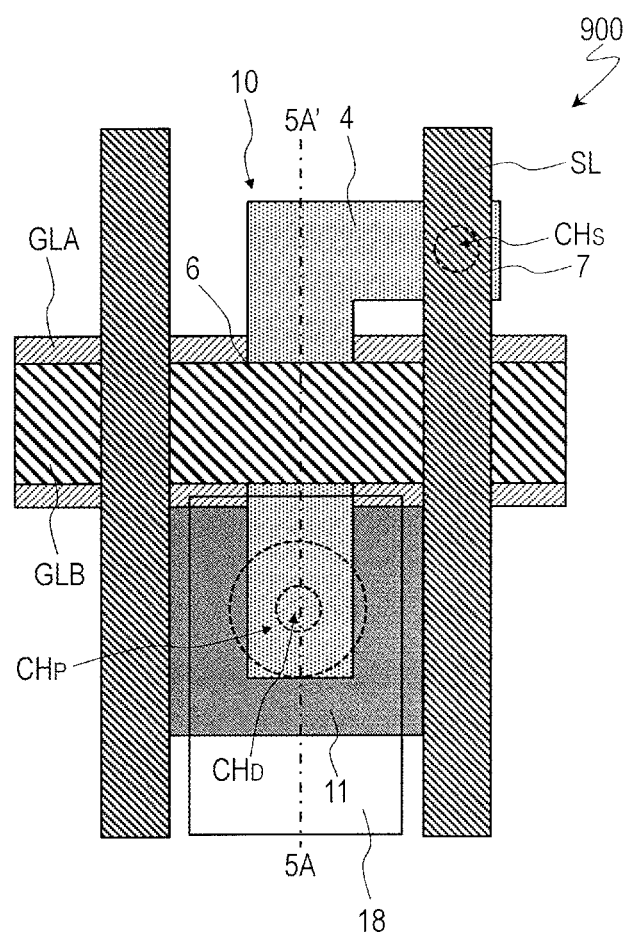
FIG. 4 is a plan view schematically illustrating an active matrix substrate 900 of a comparative example.
Figure 5:
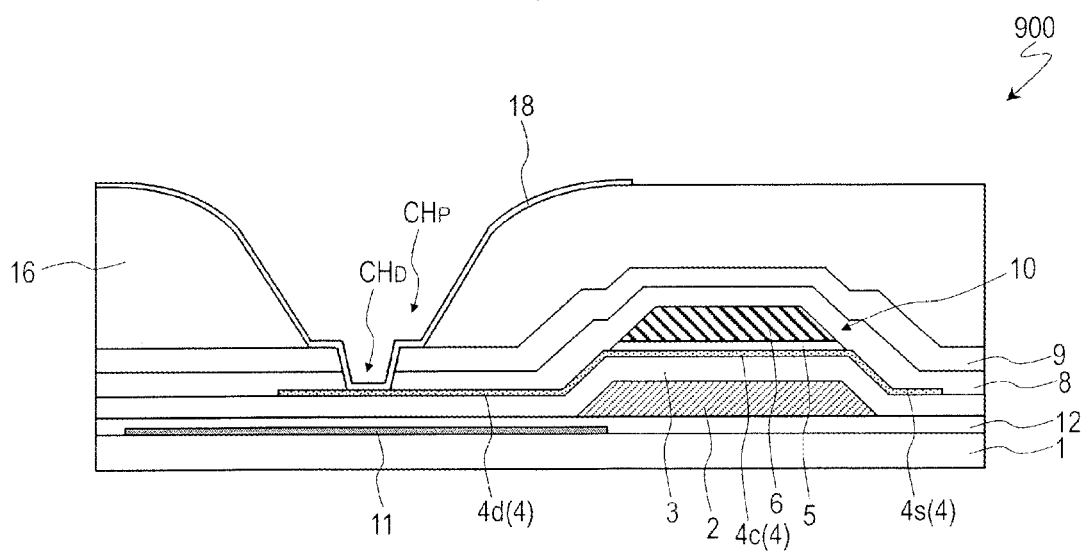
FIG. 5 is a cross-sectional view schematically illustrating the active matrix substrate 900 and illustrates a cross section taken along a line 5A-5A' in FIG. 4.

FIG. 4 and FIG. 5 illustrate an active matrix substrate 900 of a comparative example. FIG. 4 is a plan view schematically illustrating the active matrix substrate 900. FIG. 5 is a cross-sectional view schematically illustrating the active matrix substrate 900, and illustrates a cross section taken along a line 5A-5A' in FIG. 4.

The active matrix substrate 900 of the comparative example includes the TFT 10 having a double gate structure, similarly to the liquid crystal display device 100. However, in the active matrix substrate 900 of the comparative example, the pixel contact hole $CH_P$ formed in the flattened layer 16 does not overlap either the lower gate electrode 2 or the upper gate electrode 6 when viewed from the normal direction of the substrate 1, and overlaps the drain contact region 4d of the oxide semiconductor layer 4. Also, when viewed from the normal direction of the substrate 1, the pixel contact hole $CH_P$ is disposed such that the drain contact hole $CH_D$ formed in the first interlayer insulating layer 8 and the second interlayer insulating layer 9 is positioned within the pixel contact hole $CH_P$. A part of the pixel electrode 18 is in contact with the drain contact region 4d of the oxide semiconductor layer 4 in the drain contact hole $CH_D$, and thereby, the pixel electrode 18 is electrically connected to the oxide semiconductor layer 4. Thus, the active matrix substrate 900 of the comparative example is not provided with the connection electrode 14.

Additionally, the active matrix substrate 900 of the comparative example includes a light blocking layer 11 disposed so as to overlap the pixel contact hole $CH_P$ when viewed from the normal direction of the substrate 1. The light blocking layer 11 is formed on the substrate 1, and a base coat layer 12 is provided so as to cover the light blocking layer 11. The TFT 10 is formed on the base coat layer 12.

Figure 6:
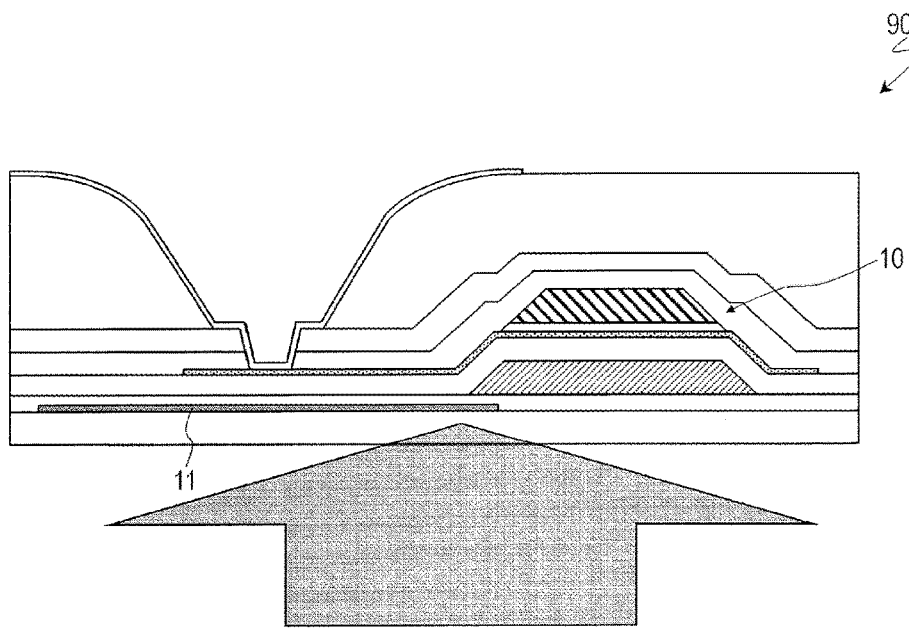
FIG. 6 is a diagram for describing a cause of reduction in transmittance in the active matrix substrate 900.

In the active matrix substrate 900 of the comparative example, in order to reliably electrically connect the pixel electrode 18 and the oxide semiconductor layer 4, the drain contact hole $CH_D$ and the pixel contact hole $CH_P$ are required to be formed so as to overlap each other, but when a positional relationship between the two is too close, there is a concern about the photosensitive resin material constituting the flattened layer 16 being left at the bottom of the drain contact hole $CH_D$ and conduction failure occurring. Due to this, an aperture diameter of the pixel contact hole $CH_P$ is required to be sufficiently large with respect to an aperture diameter of the drain contact hole $CH_D$, and it is necessary to set an exposure time to be sufficiently long when the pixel contact hole $CH_P$ is formed. Thus, since the pixel contact hole $CH_P$ has a gentle mortar shape including a tapered side face that expands from the bottom face of the pixel contact hole $CH_P$, it is difficult to reduce the size with respect to the aperture diameter of the drain contact hole $CH_D$. The pixel contact hole $CH_P$ having such a shape disrupts the orientation of liquid crystal molecules, which causes reduction in contrast ratio and display quality due to light leakage in the liquid crystal display device. Thus, light blocking is required near the pixel contact hole $CH_P$ by the light blocking layer 11 of the active matrix substrate 900 and a black matrix provided on the counter substrate, but in this case, as illustrated in FIG. 6, light from a backlight is blocked by the light blocking layer 11 and the black matrix, and thus, the transmittance is reduced.

Also, as already described, JP 2017-187714 A describes a configuration in which a contact hole formed in a flattened layer (organic insulating film) can be made shallow. In the configuration described in JP 2017-187714 A, an electrode (metal portion) that electrically connects a polysilicon semiconductor layer that is an active layer of a TFT and a pixel electrode is raised by a pedestal portion provided directly below the electrode, which makes it possible to make the contact hole formed in the flattened layer shallow.

However, when the complex structure is actually formed in the pixel as described in JP 2017-187714 A, there is a concern about light leakage. For example, a phenomenon in which an edge of a metal portion formed in an island shape shines (striation phenomenon) may occur. In order to prevent light leakage due to such a striation phenomenon, it is conceivable that light needs to be blocked near the metal portion (near the pedestal portion) by a light blocking layer of the active matrix substrate or the black matrix of the counter substrate. Thus, when the configuration described in JP 2017-187714 A is adopted, although the contact hole can be formed shallow, it is difficult to greatly increase the transmittance (greatly improve the aperture ratio).

In contrast, in the active matrix substrate 100 according to the present embodiment, when viewed from the normal direction of the substrate 1, the bottom face bf of the pixel contact hole $CH_P$ at least partially overlaps both the lower gate electrode 2 and the upper gate electrode 6. In this way, when the photosensitive resin material is exposed, a thickness of the photosensitive resin material is reduced in thickness by the thicknesses of the lower gate electrode 2 and the upper gate electrode 6 in a region where the pixel contact hole $CH_P$ is formed, and since exposure light is reflected by the lower gate electrode 2 and/or the upper gate electrode 6, the pixel contact hole $CH_P$ can be formed with less exposure time and with a smaller mask pattern. Thus, an aperture diameter of the pixel contact hole $CH_P$ can be reduced. Since the aperture diameter of the pixel contact hole $CH_P$ can be reduced, it is possible to sufficiently block light by the lower gate electrode 2 and the upper gate electrode 6 without forming the light blocking layer, and to improve the transmittance. In the active matrix substrate 100 according to the present embodiment, it is not necessary to separately form a structure such as the pedestal portion described in JP 2017-187714 A.

Figure 7:
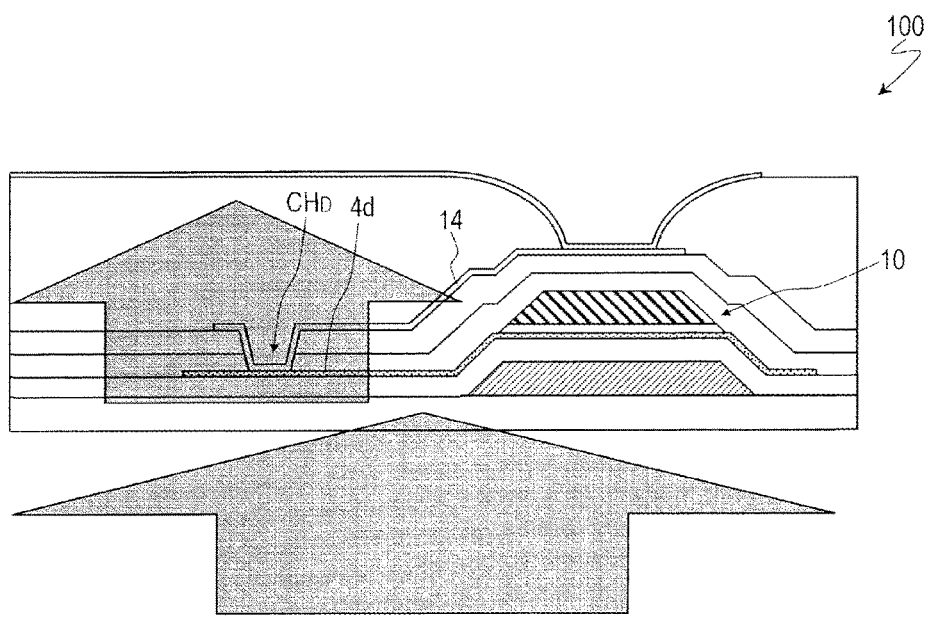
FIG. 7 is a diagram for describing a reason of improvement in transmittance in the active matrix substrate 100.

Additionally, in the active matrix substrate 100 according to the present embodiment, the connection electrode 14 for electrically connecting the drain contact region 4d of the oxide semiconductor layer 4 and the pixel electrode 18 is formed from a transparent conductive material. Thus, as illustrated in FIG. 7, the periphery of the drain contact region 4d (periphery of the drain contact hole $CH_D$) can be contributed to the display, and the aperture ratio can be increased to allow the transmittance to be further improved.

Note that, when the polysilicon semiconductor layer is used as the active layer of the TFT, as described in JP 2017-187714 A, a junction between a material exhibiting n-type semiconductor characteristics such as ITO and IZO to be used as the transparent conductive material and the polysilicon semiconductor is not an ohmic contact but a heterojunction between different types of semiconductors having greatly different energy levels, and thus, direct contact is impossible. Due to this, there is a constraint that the connection electrode for electrically connecting the polysilicon semiconductor layer and the pixel electrode needs to be formed from a metal material. In contrast, as in the present embodiment, when the active layer of the TFT 10 is the oxide semiconductor layer 4, the components and electrical characteristics are similar to those of the transparent conductive material (for example, ITO or IZO), and thus, the connection electrode 14 can be formed from a transparent conductive material. When the connection electrode 14 is formed from the transparent conductive material, the striation phenomenon does not occur, and the periphery of the drain contact hole $CH_D$ can be contributed to the display.

Note that, as long as the bottom face bf of the pixel contact hole $CH_P$ at least partially overlaps at least the lower gate electrode 2 of the lower gate electrode 2 and the upper gate electrode 6 when viewed from the normal direction of the substrate 1, the effects of reducing the aperture diameter of the pixel contact hole $CH_P$, and improving the transmittance can be obtained. However, from the perspective of further improving the transmittance, the bottom face bf of the pixel contact hole $CH_P$ preferably at least partially overlaps both the lower gate electrode 2 and the upper gate electrode 6, and the entirety of the bottom face bf of the pixel contact hole $CH_P$ more preferably overlaps both the lower gate electrode 2 and the upper gate electrode 6.

Next, an example of a method for manufacturing the active matrix substrate 100 according to the present embodiment will be described with reference to FIG. 8A to FIG. 11B. FIG. 8A to FIG. 11B are process cross-sectional views illustrating processes for manufacturing the active matrix substrate 100.

Figure 8A:
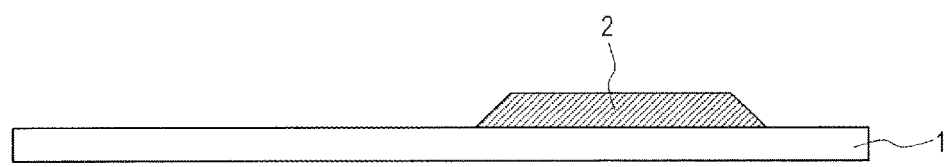
FIG. 8A is a process cross-sectional view illustrating a process for manufacturing the active matrix substrate 100.

First, as illustrated in FIG. 8A, the lower gate electrode 2 and the lower gate wiring line GLA (that is, the lower gate metal layer) are formed on the substrate 1. For example, after a conductive film is deposited by sputtering, the lower gate electrode 2 and the lower gate wiring line GLA can be formed by patterning the conductive film by a photolithography process.

A glass substrate, a silicon substrate, a plastic substrate (resin substrate) having heat resistance, or the like can be used as the substrate 1, for example. As the conductive film (lower gate metal film) for forming the lower gate electrode 2 and the lower gate wiring line GLA, for example, a film containing a metal such as aluminum (Al), tungsten (W), molybdenum (Mo), tantalum (Ta), chromium (Cr), titanium (Ti), or copper (Cu), or an alloy thereof, or a metal nitride thereof, can be appropriately used. Further, a layered film obtained by layering such a plurality of films may be used. Here, a film obtained by layering a Tantalum Nitride (TaN) film and a W film in this order is used as the lower gate metal film. A thickness of the lower gate metal film is, for example, 100 nm or greater and 500 nm or less.

Figure 8B:
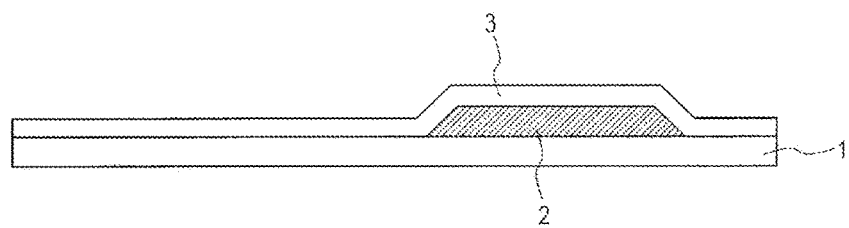
FIG. 8B is a process cross-sectional view illustrating a process for manufacturing the active matrix substrate 100.

Next, as illustrated in FIG. 8B, the lower gate insulating layer 3 covering the lower gate electrode 2 and the lower gate wiring line GLA is formed. The lower gate insulating layer 3 can be formed by, for example, CVD. As the lower gate insulating layer 3, a silicon oxide ($SiO_2$) layer, a silicon nitride (SiNx) layer, a silicon oxynitride (SiOxNy; x>y)

layer, a silicon nitride oxide (SiNxOy; x>y) layer, or the like may be used as appropriate. The lower gate insulating layer 3 may have a layered structure. For example, a SiNx layer may be formed at the substrate 1 side as a lower layer in order to prevent diffusion of impurities and the like from the substrate 1, and a $SiO_2$ layer may be formed on the SiNx layer as an upper layer in order to ensure the insulating property. A thickness of the lower gate insulating layer 3 is, for example, 150 nm or greater and 400 nm or less.

Figure 8C:
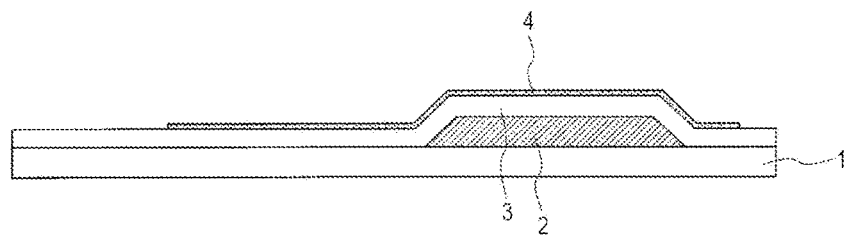
FIG. 8C is a process cross-sectional view illustrating a process for manufacturing the active matrix substrate 100.

Subsequently, as illustrated in FIG. 8C, the oxide semiconductor layer 4 is formed on the lower gate insulating layer 3. For example, after an oxide semiconductor film is deposited by sputtering, the oxide semiconductor film is patterned by a photolithography process, and thus, the oxide semiconductor layer 4 having an island shape can be formed. The oxide semiconductor layer 4 is formed so as to face the lower gate electrode 2 with the lower gate insulating layer 3 interposed therebetween. Here, as the oxide semiconductor layer 4, an In—Ga—Zn—O based semiconductor layer having a composition ratio of In:Ga:Zn=1:1:1 is formed. A thickness of the oxide semiconductor layer 4 is, for example, 10 nm or greater and 200 nm or less.

Figure 8D:
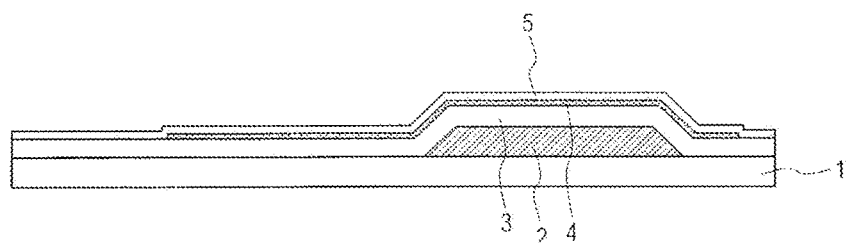
FIG. 8D is a process cross-sectional view illustrating a process for manufacturing the active matrix substrate 100.

Next, as illustrated in FIG. 8D, the upper gate insulating layer 5 is deposited so as to cover the oxide semiconductor layer 4. The upper gate insulating layer 5 is deposited by CVD, for example. Thereafter, the oxide semiconductor layer 4 is subjected to oxidation treatment (for example, baking or peroxidation treatment). As the upper gate insulating layer 5, for example, an insulating layer (exemplified as the lower gate insulating layer 3) similar to the lower gate insulating layer 3 can be used. Here, a silicon oxide ($SiO_2$) layer is formed as the upper gate insulating layer 5. When an oxide layer such as a silicon oxide layer is used as the upper gate insulating layer 5, since oxygen deficiencies generated in the channel region 4c of the oxide semiconductor layer 4 can be reduced by the oxide layer, the resistance reduction in the channel region can be suppressed. A thickness of the upper gate insulating layer 5 is, for example, 50 nm or greater and 150 nm or less.

Figure 9A:
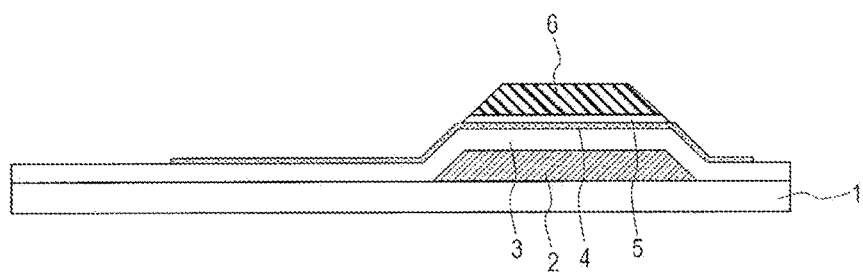
FIG. 9A is a process cross-sectional view illustrating a process for manufacturing the active matrix substrate 100.

Subsequently, as illustrated in FIG. 9A, the upper gate electrode 6 and the upper gate wiring line GLB (that is, the upper gate metal layer) are formed on the upper gate insulating layer 5. For example, after a conductive film (upper gate metal film) is deposited by sputtering, the upper gate electrode 6 and the upper gate wiring line GLB can be formed by patterning the upper gate metal film by a photolithography process. Thereafter, the upper gate insulating layer 5 is patterned. Note that the upper gate insulating layer 5 can be patterned collectively with the upper gate metal film. As the upper gate metal film, for example, a film containing a metal such as aluminum (Al), tungsten (W), molybdenum (Mo), tantalum (Ta), chromium (Cr), titanium (Ti), or copper (Cu), or an alloy thereof, or a metal nitride thereof, can be used. Here, as the upper gate metal film, a film obtained by layering a Ti film, an Al film, and a Ti film in this order is used. A thickness of the upper gate metal film is, for example, 100 nm or greater and 400 nm or less.

Thereafter, processing for lowering the resistance of the oxide semiconductor layer 4 may be performed using the upper gate insulating layer 5 and the upper gate electrode 6 as a mask. Plasma processing can be used as the processing for lowering the resistance, for example. By the processing for lowering the resistance, a region of the oxide semiconductor layer 4 that does not overlap the upper gate insulating layer 5 and the upper gate electrode 6 (a region that serves as the source contact region 4s and the drain contact region 4d) serves as a low-resistance region having a lower specific resistance than that of a region of the oxide semiconductor layer 4 that overlaps the upper gate insulating layer 5 and the upper gate electrode 6 (a region that serves as the channel region 4c). The low-resistance region may be a conductive region (sheet resistance of 200Ω/☐ or less, for example). Note that the plasma processing may be performed by using the upper gate electrode 6 as a mask without patterning the upper gate insulating layer 5. In that case, the photolithography process of the upper gate insulating layer 5 can be omitted, and thus, the manufacturing process can be shortened. In addition, the method of the processing for lowering the resistance is not limited to the plasma processing. For example, the resistance can also be lowered by bringing an exposed region of the oxide semiconductor layer 4 into contact with an insulating film with a reducing property that can reduce an oxide semiconductor. Alternatively, the resistance can also be lowered by ion implantation processing such as ion doping to the oxide semiconductor layer 4, for example. Also in this case, the ion implantation processing can be performed through the upper gate insulating layer 5, and thus, the process can be shortened.

Figure 9B:
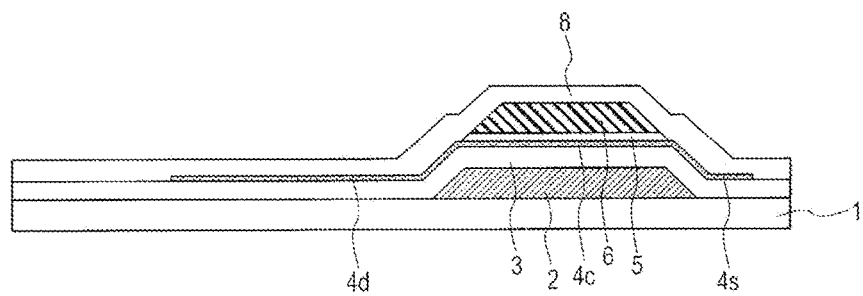
FIG. 9B is a process cross-sectional view illustrating a process for manufacturing the active matrix substrate 100.

Subsequently, as illustrated in FIG. 9B, the first interlayer insulating layer 8 that covers the oxide semiconductor layer 4 and the upper gate electrode 6 is formed. For example, the first interlayer insulating layer 8 can be formed by CVD. As the first interlayer insulating layer 8, an inorganic insulating layer such as a silicon oxide ($SiO_2$) layer, a silicon nitride (SiNx) layer, a silicon oxynitride (SiOxNy; x>y) layer, or a silicon nitride oxide (SiNxOy; x>y) layer may be used as a single layer or in a layered state. A thickness of the first interlayer insulating layer 8 is, for example, 200 nm or greater and 700 nm or less. Here, a silicon oxide layer is used as the first interlayer insulating layer 8.

Subsequently, the source contact hole $CH_S$ is formed in the first interlayer insulating layer 8 so as to expose a part of the source contact region 4s of the oxide semiconductor layer 4. The source contact hole $CH_S$ can be formed by patterning the first interlayer insulating layer 8 in a photolithography process.

Next, the source electrode 7 and the source wiring line SL (that is, the source metal layer) are formed on the first interlayer insulating layer 8. For example, after the conductive film is deposited by the sputtering, the conductive film is patterned by the photolithography process, which allows the source electrode 7 and the source wiring line SL to be formed. As the conductive film for forming the source electrode 7 and the source wiring line SL (source metal film), a film containing a metal such as aluminum (Al), tungsten (W), molybdenum (Mo), tantalum (Ta), copper (Cu), chromium (Cr), or titanium (Ti), or an alloy thereof, or a metal nitride thereof, can be appropriately used. Further, a layered film obtained by layering such a plurality of films may be used. Here, a film obtained by layering a Ti film, an Al film, and a Ti film in this order is used as the source metal film. A thickness of the source metal film is, for example, 200 nm or greater and 700 nm or less.

Figure 9C:
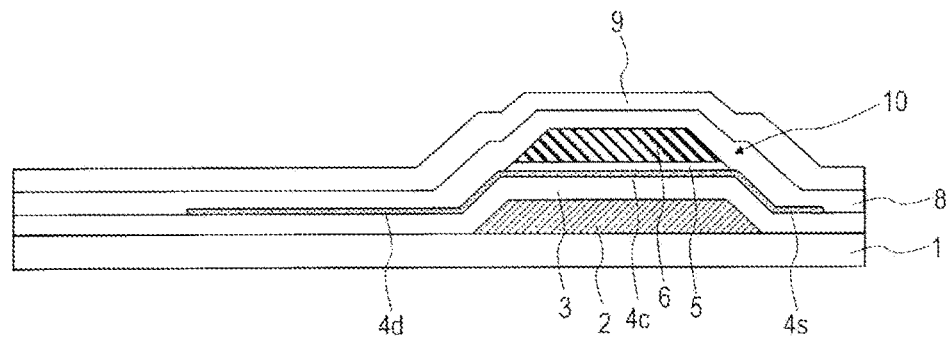
FIG. 9C is a process cross-sectional view illustrating a process for manufacturing the active matrix substrate 100.

Next, as illustrated in FIG. 9C, the second interlayer insulating layer 9 is formed to cover the TFT 10. The second interlayer insulating layer 9 can be formed by, for example, CVD. As the second interlayer insulating layer 9, an inorganic insulating layer such as a silicon oxide ($SiO_2$) layer, a silicon nitride (SiNx) layer, a silicon oxynitride (SiOxNy; x>y) layer, or a silicon nitride oxide (SiNxOy; x>y) layer can be used as a single layer or in a layered state. A thickness of the second interlayer insulating layer 9 is, for example, 100 nm or greater and 600 nm or less. Here, a silicon nitride layer is used as the second interlayer insulating layer 9.

Figure 10A:
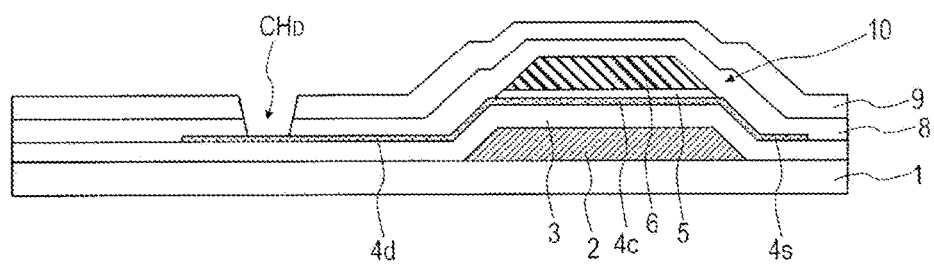
FIG. 10A is a process cross-sectional view illustrating a process for manufacturing the active matrix substrate 100.

Next, as illustrated in FIG. 10A, the drain contact hole $CH_D$ is formed in the first interlayer insulating layer 8 and the second interlayer insulating layer 9 such that a part of the drain contact region 4d of the oxide semiconductor layer 4 is exposed. The drain contact hole $CH_D$ can be formed by patterning the first interlayer insulating layer 8 and the second interlayer insulating layer 9 in a photolithography process, for example. The drain contact hole $CH_D$ is formed, for example, in a square from 1.5 μm to 2.5 μm.

Figure 10B:
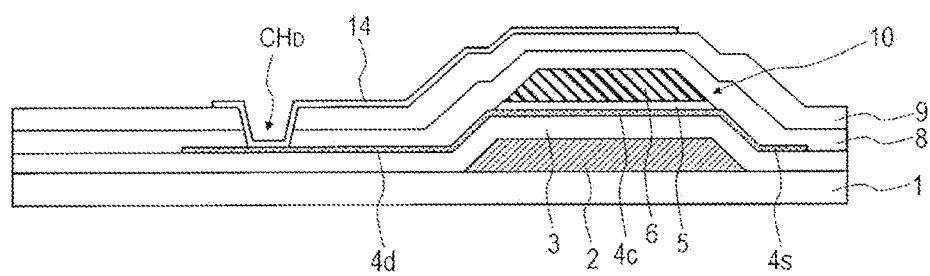
FIG. 10B is a process cross-sectional view illustrating a process for manufacturing the active matrix substrate 100.

Subsequently, as illustrated in FIG. 10B, the connection electrode 14 is formed on the second interlayer insulating layer 9. For example, after a transparent conductive film is deposited by sputtering, the connection electrode 14 can be formed by patterning the transparent conductive film by the photolithography process. As the transparent conductive material for forming the connection electrode 14, for example, Indium Tin Oxide (ITO), or Indium Zinc Oxide (IZO) can be used. Here, indium zinc oxide is used. A thickness of the connection electrode 14 is, for example, 30 nm or greater and 100 nm or less.

Figure 11A:
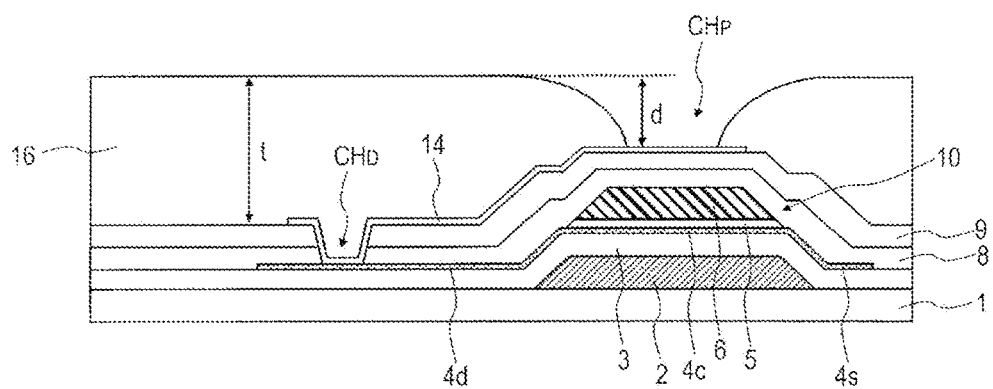
FIG. 11A is a process cross-sectional view illustrating a process for manufacturing the active matrix substrate 100.

Next, as illustrated in FIG. 11A, the flattened layer 16 is formed to cover the second interlayer insulating layer 9 and the connection electrode 14. For example, by applying a photosensitive resin material and performing exposure and development, the flattened layer 16 in which the pixel contact hole $CH_P$ is formed so as to expose a part of the connection electrode 14 is obtained. As the photosensitive resin material, photosensitive acrylic resin, for example, can be used. A thickness t of the flattened layer 16 in a flat portion (a portion that does not overlap the lower gate electrode 2 and the upper gate electrode 6) is, for example, approximately from 2.5 μm to 3.0 μm. When each of the thicknesses of the lower gate electrode 2 and the upper gate electrode 6 is about 300 nm, a depth d of the pixel contact hole $CH_P$ is, for example, about 2.2 μm. The pixel contact hole $CH_P$ is formed, for example, in a square from 2.5 μm to 3.5 μm.

Figure 11B:
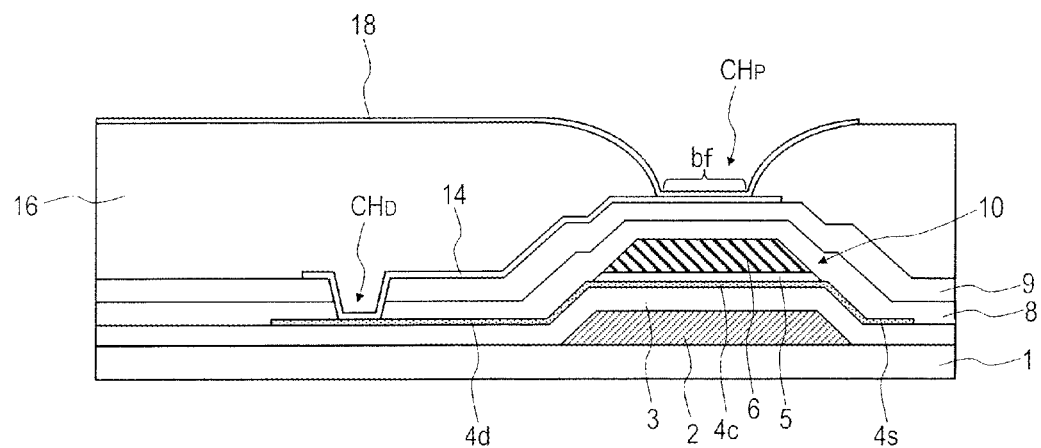
FIG. 11B is a process cross-sectional view illustrating a process for manufacturing the active matrix substrate 100.

Subsequently, as illustrated in FIG. 11B, the pixel electrode 18 is formed on the flattened layer 16. For example, after a transparent conductive film is deposited by sputtering, the pixel electrode 18 can be formed by patterning the transparent conductive film by the photolithography process. For example, indium tin oxide, or indium zinc oxide can be used as the transparent conductive material for forming the pixel electrode 18. Here, indium zinc oxide is used. A thickness of the pixel electrode 18 is, for example, 30 nm or greater and 100 nm or less.

Next, a dielectric layer covering the pixel electrode is formed. The dielectric layer can be formed, for example, by CVD. As the dielectric layer, for example, an inorganic insulating layer similar to those used for the first interlayer insulating layer 8 and the second interlayer insulating layer 9 can be used. Here, a silicon nitride layer is used as the dielectric layer. A thickness of the dielectric layer is, for example, 50 nm or greater and 300 nm or less.

Thereafter, a common electrode is formed on the dielectric layer. For example, the common electrode can be formed by depositing a transparent conductive film by sputtering and then patterning the transparent conductive film by a photolithography process. For example, indium tin oxide, or indium zinc oxide can be used as a transparent conductive material for forming the common electrode. Here, indium zinc oxide is used. A thickness of the common electrode is, for example, 30 nm or greater and 100 nm or less. In this manner, the active matrix substrate 100 is obtained.

Note that when a pixel pitch is large to the extent that a sufficient interval can be provided between the source electrode 7 and the connection electrode 14, the connection electrode 14 may be provided in the same layer as that of the source electrode 7 (that is, may be provided on the first interlayer insulating layer 8). In this case, the second interlayer insulating layer 9 is omitted, which allows the manufacturing process to be simplified.

Second Embodiment

Figure 12:
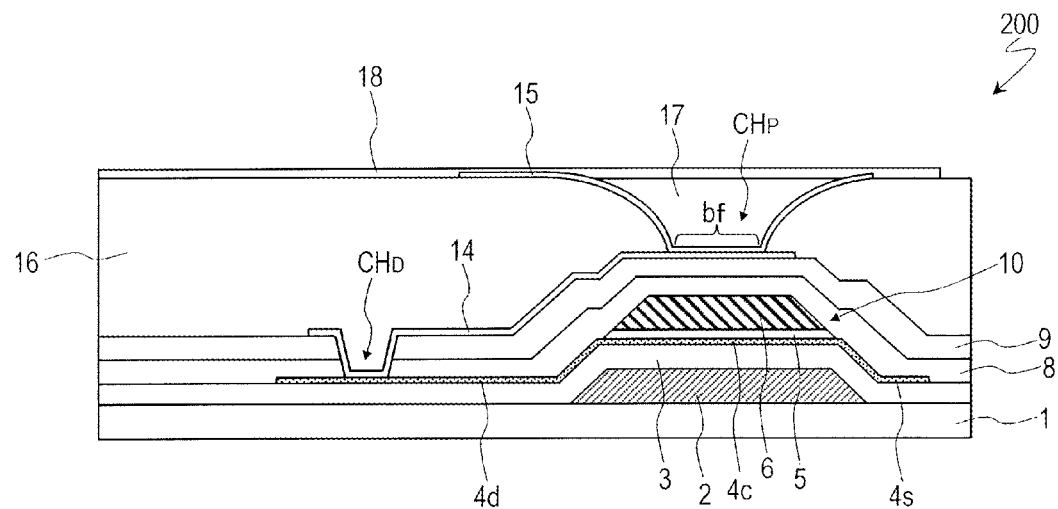
FIG. 12 is a cross-sectional view schematically illustrating another active matrix substrate 200 according to an embodiment of the disclosure.

First, an active matrix substrate 200 according to the present embodiment will be described with reference to FIG. 12. FIG. 12 is a cross-sectional view schematically illustrating the active matrix substrate 200. In the following, points at which the active matrix substrate 200 is different from the active matrix substrate 100 according to the first embodiment will be mainly described.

The active matrix substrate 200 according to the present embodiment differs from the active matrix substrate 100 according to the first embodiment in that the active matrix substrate 200 includes an additional connection electrode 15 and an additional flattened layer 17, as illustrated in FIG. 12. In the following description, the connection electrode 14 and the flattened layer 16 are respectively referred to as a "first connection electrode" and a "first flattened layer", and the additional connection electrode 15 and the additional flattened layer 17 are respectively referred to as a "second connection electrode" and a "second flattened layer".

The second connection electrode 15 is formed from a transparent conductive material, and electrically connects the first connection electrode 14 and the pixel electrode 18. In the pixel contact hole $CH_P$, the second connection electrode 15 is in contact with the first connection electrode 14.

The second flattened layer 17 is formed so as to fill the pixel contact hole $CH_P$. The second flattened layer 17 covers a part of the second connection electrode 15. The second flattened layer 17 is formed from, for example, a photosensitive resin material.

The pixel electrode 18 is in contact with a portion of the second connection electrode 15 that is not covered by the second flattened layer 17. The pixel electrode 18 includes a portion positioned on the second flattened layer 17.

The second connection electrode 15 and the pixel electrode 18 are formed from a transparent conductive material. Here, the second connection electrode 15 and the pixel electrode 18 are formed from indium zinc oxide.

In the active matrix substrate 200 according to the present embodiment, since the second flattened layer 17 is formed so as to fill the pixel contact hole $CH_P$, and the pixel electrode 18 includes a portion positioned on the second flattened layer 17, the alignment disturbance of liquid crystal molecules caused by the pixel contact hole $CH_P$ is suppressed, and thus, the transmittance can be further improved.

Although the example in which the size of the second connection electrode 15 is smaller than the size of the pixel electrode 18 is illustrated in FIG. 12, the size of the second connection electrode 15 may be substantially the same as the size of the pixel electrode 18.

Similarly to the first flattened layer 16, the second flattened layer 17 may be formed by, for example, applying a photosensitive resin material, and performing exposure and development. By using a multi-gray-scale mask as a mask during the exposure, the second flattened layer 17 can accurately fill the pixel contact hole $CH_P$. Specifically, a graytone mask or a halftone mask can be used as the multi-gray-scale mask. A slit with a resolution less than or equal to a resolution of an exposure device is formed in the graytone mask, and intermediate exposure is achieved by blocking some of the light by the slit. On the other hand, intermediate exposure is achieved by using a transflective film in the halftone mask.

Figure 13:
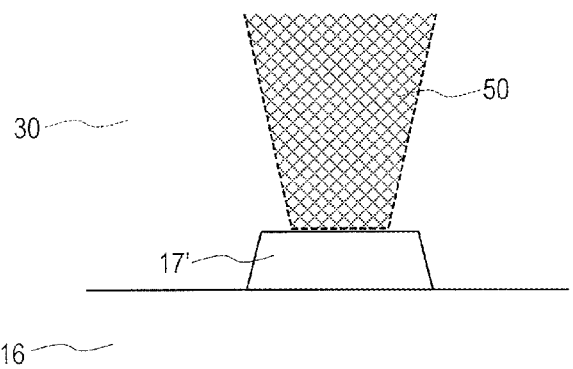
FIG. 13 is a cross-sectional view schematically illustrating a spacer receiving portion 17' provided to the active matrix substrate 200.

Note that when the second flattened layer 17 is formed, by leaving the photosensitive resin material in an island shape or a belt shape on the first flattened layer 16, as illustrated in FIG. 13, a structure 17' (hereinafter referred to as a "spacer receiving portion") for receiving a columnar spacer 50 (sometimes referred to as a "photo spacer", "PS", or the like) may be formed. The columnar spacer 50 is provided at a liquid crystal layer 30 side of a counter substrate 500, which will be described below. The spacer receiving portion 17' is disposed in a region corresponding to the columnar spacer 50. Note that although not illustrated here, a dielectric layer and a common electrode may be formed on the spacer receiving portion 17'. In addition, in designing the mask, the spacer receiving portions 17' having different heights can be mixed by changing the setting of the intermediate exposure described above, and thus, a cell thickness can be optimized, and the strength during the pushing pressure test and the display quality can be improved.

The second connection electrode 15 may be formed by, for example, patterning a transparent conductive film by a photolithography process after depositing the transparent conductive film by sputtering. As the transparent conductive material for forming the second connection electrode 15, for example, indium tin oxide, or indium zinc oxide may be used. A thickness of the second connection electrode 15 is, for example, 30 nm or greater and 100 nm or less.

When misalignment occurs in the photolithography process in forming the second connection electrode 15, finished second connection electrodes 15 may vary. When the second connection electrode 15 and the pixel electrode 18 are formed from an identical transparent conductive material, even when a part of the second connection electrode 15 protrudes from the region formed with the pixel electrode 18, the protruding portion is removed when the transparent conductive film for the pixel electrode 18 is patterned (etched). That is, the second connection electrode 15 may be patterned in the same size as that of the mask pattern of the pixel electrode 18 in a self-matching manner.

As already described above, indium tin oxide or indium zinc oxide can be used as the material of the second connection electrode 15. However, indium tin oxide is crystallized by the thermal history from the process, becoming hard to dissolve. In contrast, indium zinc oxide is easily maintained in an amorphous state even with the thermal history, and can be easily dissolved with a PAN-based etchant. Thus, indium zinc oxide is preferably used as the material of the second connection electrode 15 (hereinafter referred to as a "first countermeasure").

When indium tin oxide is used as the material of the second connection electrode 15, the size of the second connection electrode 15 is preferably smaller than that of the pixel electrode 18 by a value greater than or equal to a process margin (hereinafter referred to as a "second countermeasure"). In this way, even when misalignment occurs for each of the second connection electrode 15 and the pixel electrode 18, the protrusion of a part of the second connection electrode 15 from the region formed of the pixel electrode 18 can be suppressed.

Since the total summed area of the areas of the second connection electrode 15 and the pixel electrode 18 functions as an effective pixel electrode (here, simply referred to as a pixel electrode), both the first countermeasure and the second countermeasure can prevent the area of the pixel electrode from being made larger than necessary. That is, it is not only possible to reduce a parasitic capacitance between the source electrode 7 and the pixel electrode, but also possible to avoid the variation in parasitic capacitance caused by the variation in positions of the second connection electrode 15 and the source electrode 7 (This is because the pixel electrode 18 has a size larger than or equivalent to that of the second connection electrode 15. When misalignment occurs, the second connection electrode 15 may protrude from the pixel electrode 18 and come closer to the source electrode 7, and it is possible to prevent the parasitic capacitance from increasing).

Third Embodiment

Figure 14:
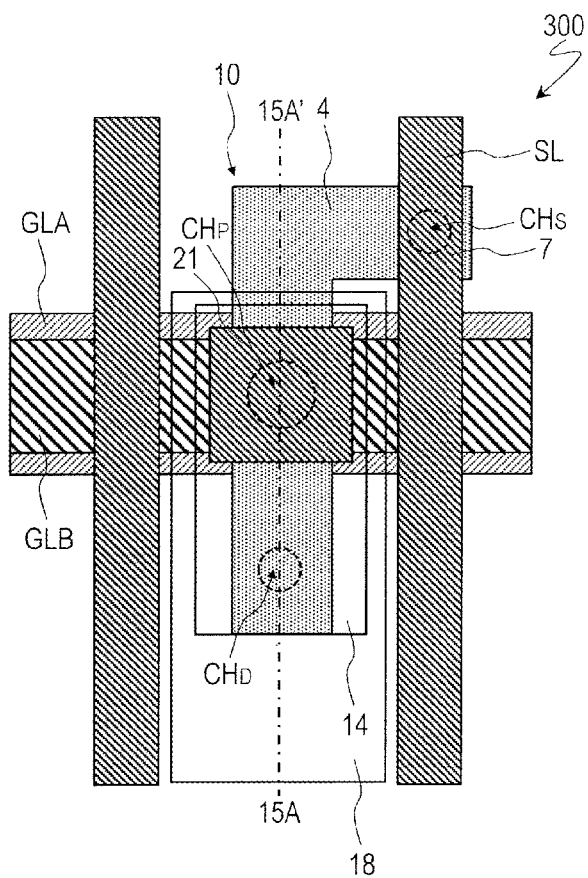
FIG. 14 is a plan view schematically illustrating still another active matrix substrate 300 according to an embodiment of the disclosure.
Figure 15:
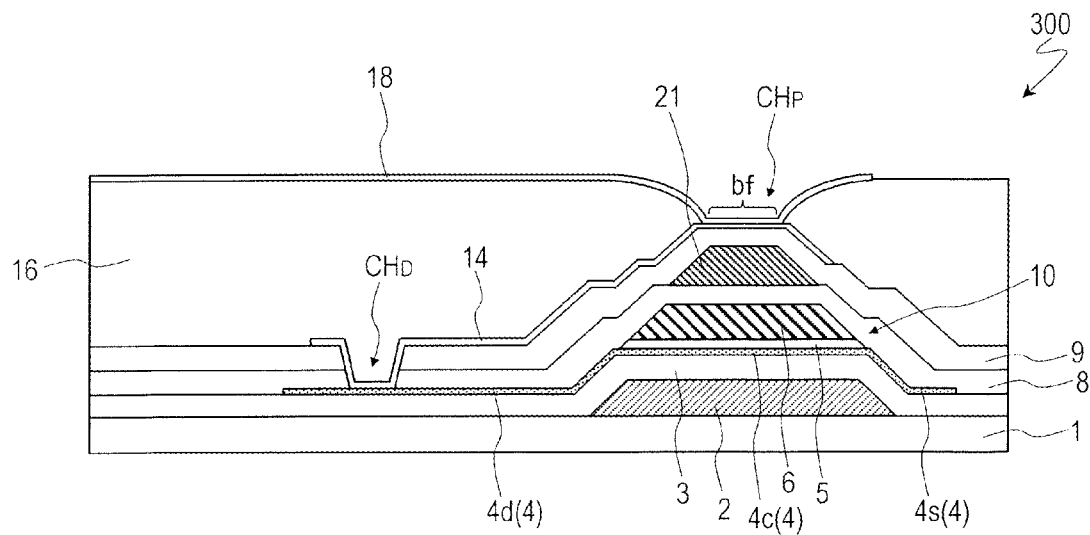
FIG. 15 is a cross-sectional view schematically illustrating the active matrix substrate 300, and illustrates a cross section taken along a line 15A-15A' in FIG. 14.

First, an active matrix substrate 300 according to the present embodiment will be described with reference to FIG. 14 and FIG. 15. FIG. 14 is a plan view schematically illustrating the active matrix substrate 300. FIG. 15 is a cross-sectional view schematically illustrating the active matrix substrate 300, and illustrates a cross section taken along a line 15A-15A' in FIG. 14. In the following, points at which the active matrix substrate 300 is different from the active matrix substrate 100 according to the first embodiment will be mainly described.

In the active matrix substrate 300 according to the present embodiment, as illustrated in FIG. 14 and FIG. 15, an island-shaped electrode 21 is provided in the same layer as that of the source electrode 7 (by patterning an identical conductive film) in a separated manner from the source electrode 7. That is, the source metal layer includes the island-shaped electrode 21 in addition to the source electrode 7 and the source wiring line SL.

When viewed from the normal direction of the substrate 1, the bottom face bf of the pixel contact hole $CH_P$ at least partially overlaps both the lower gate metal layer and the upper gate metal layer (more specifically, both the lower gate electrode 2 and the upper gate electrode 6). Additionally, in the present embodiment, the bottom face bf of the pixel contact hole $CH_P$ also at least partially overlaps the source metal layer. More specifically, the bottom face bf of the pixel contact hole $CH_P$ at least partially overlaps the island-shaped electrode 21. In the illustrated example, the entirety of the bottom face bf of the pixel contact hole $CH_P$ overlaps the island-shaped electrode 21.

As described above, in the active matrix substrate 300 according to the present embodiment, the bottom face bf of the pixel contact hole $CH_P$ formed in the flattened layer 16 at least partially overlaps the island-shaped electrode 21 as well as the lower gate electrode 2 and the upper gate electrode 6. This can further reduce an aperture diameter of the pixel contact hole $CH_P$.

Note that the configuration of the active matrix substrate 300 according to the present embodiment may be combined with the configuration in which the second flattened layer 17 and the second connection electrode 15 are provided as in the active matrix substrate 200 according to the second embodiment.

Fourth Embodiment

Figure 16:
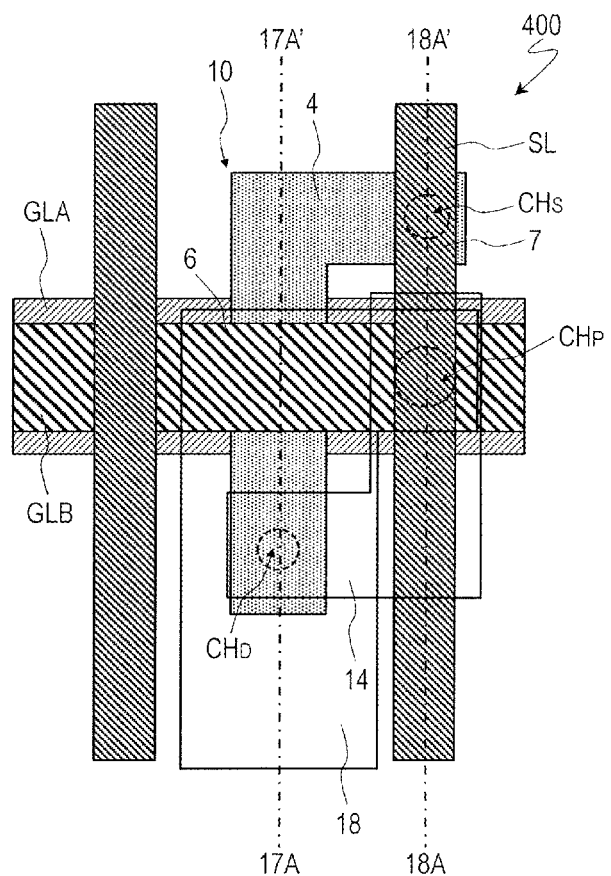
FIG. 16 is a plan view schematically illustrating still another active matrix substrate 400 according to an embodiment of the disclosure.
Figure 17:
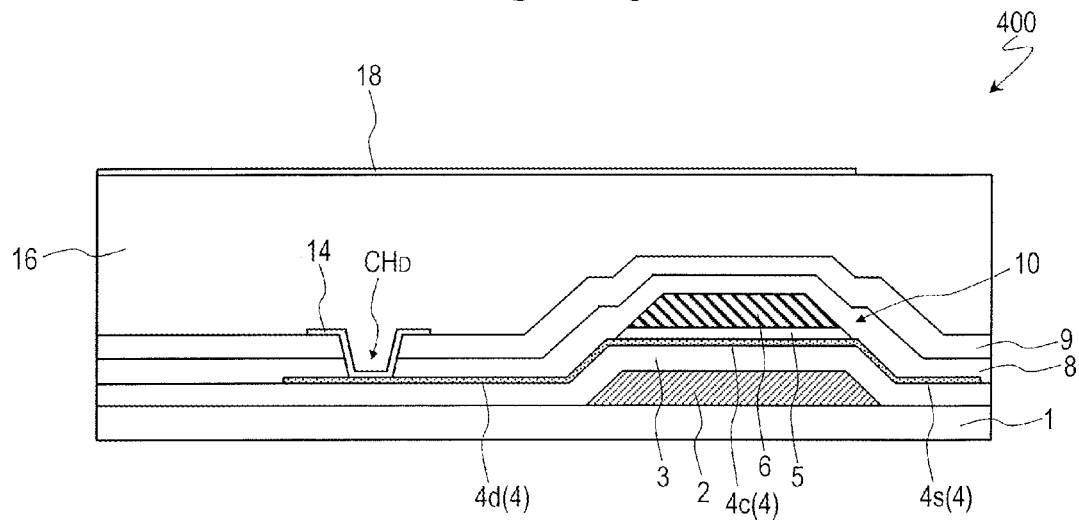
FIG. 17 is a cross-sectional view schematically illustrating the active matrix substrate 400, and illustrates a cross section taken along a line 17A-17A' in FIG. 16.
Figure 18:
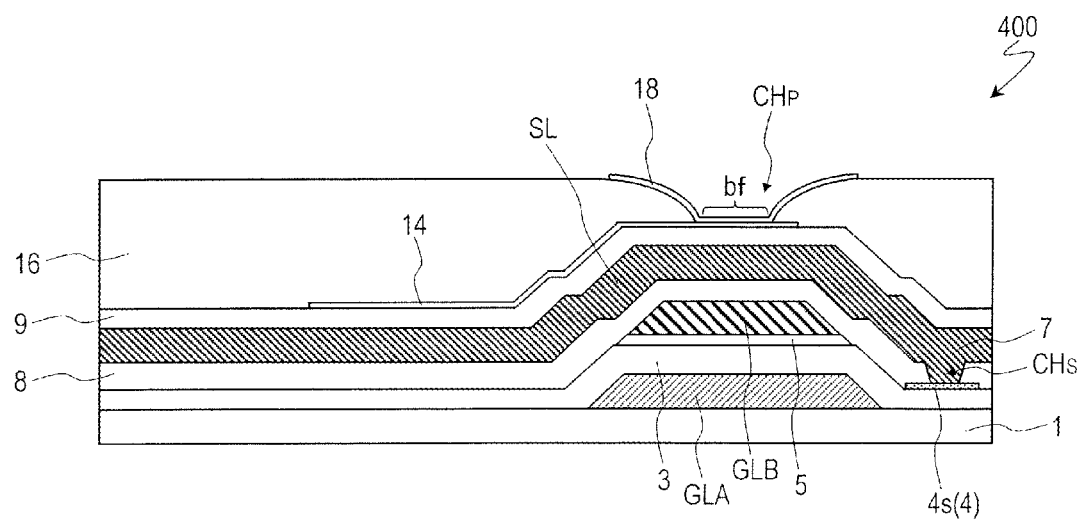
FIG. 18 is a cross-sectional view schematically illustrating the active matrix substrate 400, and illustrates a cross section taken along a line 18A-18A' in FIG. 16.

An active matrix substrate 400 according to the present embodiment will be described with reference to FIG. 16, FIG. 17, and FIG. 18. FIG. 16 is a plan view schematically illustrating the active matrix substrate 400. FIG. 17 and FIG. 18 are cross-sectional views schematically illustrating the active matrix substrate 400, and illustrate cross sections taken along a line 17A-17A' and a line 18A-18A' in FIG. 16, respectively. In the following, points at which the active matrix substrate 400 is different from the active matrix substrate 100 according to the first embodiment will be mainly described.

In the active matrix substrate 400 according to the present embodiment, when viewed from the normal direction of the substrate 1, the bottom face bf of the pixel contact hole $CH_P$ at least partially overlaps both the lower gate wiring line GLA and the upper gate wiring line GLB. In the illustrated example, the entirety of the bottom face bf of the pixel contact hole $CH_P$ overlaps both the lower gate wiring line GLA and the upper gate wiring line GLB.

In this manner, the bottom face bf of the pixel contact hole $CH_P$ at least partially overlaps both the lower gate wiring line GLA and the upper gate wiring line GLB, which allows the aperture diameter of the pixel contact hole $CH_P$ to be reduced, and allows the transmittance to be improved.

Note that, when the bottom face bf of the pixel contact hole $CH_P$ at least partially overlaps at least the lower gate wiring line GLA of the lower gate wiring line GLA and the upper gate wiring line GLB when viewed from the normal direction of the substrate 1, the effect of reducing the aperture diameter of the pixel contact hole $CH_P$, and improving the transmittance can be obtained. However, from the perspective of improving the transmittance, the bottom face bf of the pixel contact hole $CH_P$ preferably at least partially overlaps both the lower gate wiring line GLA and the upper gate wiring line GLB, and the entirety of the bottom face bf of the pixel contact hole $CH_P$ more preferably overlaps both the lower gate wiring line GLA and the upper gate wiring line GLB.

Additionally, in the active matrix substrate 400 according to the present embodiment, when viewed from the normal direction of the substrate 1, the bottom face bf of the pixel contact hole $CH_P$ overlaps the source wiring line SL at least partially (as a whole in the illustrated example). This can further reduce the aperture diameter of the pixel contact hole $CH_P$.

Note that the configuration of the active matrix substrate 400 according to the present embodiment may be combined with the configuration in which the second flattened layer 17 and the second connection electrode 15 are provided as in the active matrix substrate 200 according to the second embodiment.

Fifth Embodiment

Figure 19:
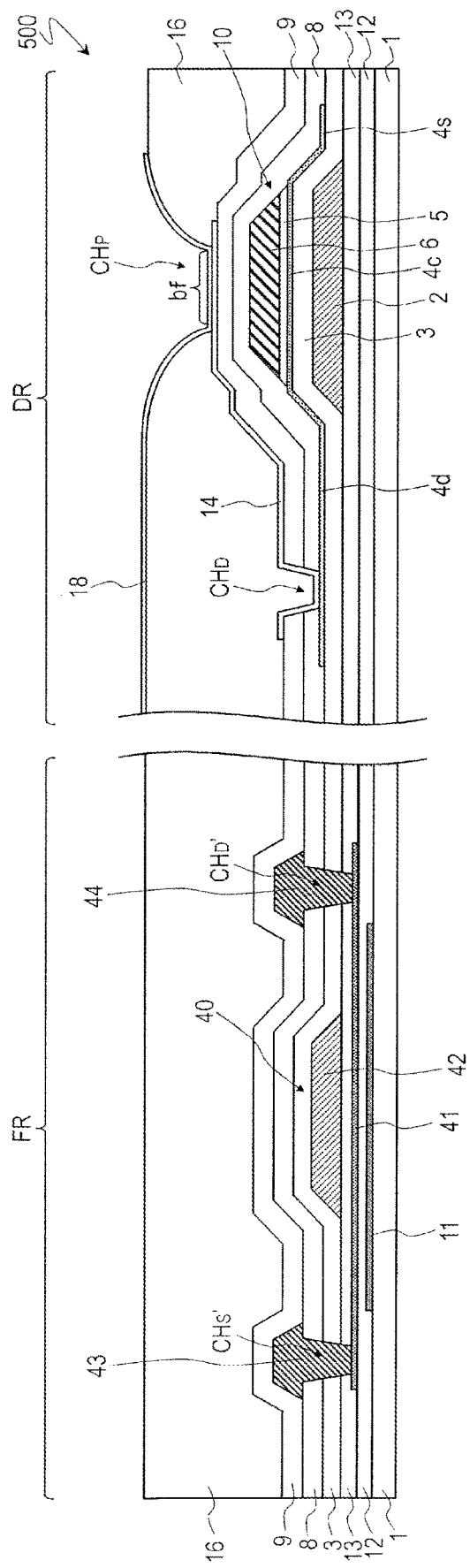
FIG. 19 is a cross-sectional view schematically illustrating still another active matrix substrate 500 according to an embodiment of the disclosure.

First, an active matrix substrate 500 according to the present embodiment will be described with reference to FIG. 19. FIG. 19 is a cross-sectional view schematically illustrating the active matrix substrate 500. A part of the display region DR is illustrated at the right side of FIG. 19, and a part of the non-display region FR is illustrated at the left side of FIG. 19. In the following, points at which the active matrix substrate 500 is different from the active matrix substrate 100 according to the first embodiment will be mainly described.

As illustrated in FIG. 19, the active matrix substrate 500 includes a first TFT 10 and a second TFT 40 that are supported by the substrate 1. The first TFT 10 is a pixel TFT disposed in each pixel region P of the display region DR, and is an oxide semiconductor TFT including the oxide semiconductor layer 4 as an active layer. The structure of the display region DR of the active matrix substrate 100 is substantially the same as the structure of the display region DR of the active matrix substrate 100 according to the first embodiment (or the structure of the display region DR of the active matrix substrates 200, 300, and 400 according to the second, third, and fourth embodiments).

The second TFT 40 is provided in the non-display region. The second TFT 40 is a crystalline silicon TFT including a crystalline silicon semiconductor layer 41 as an active layer. Furthermore, the second TFT 40 is a circuit TFT constituting a peripheral circuit, and constitutes, for example, a Gate Driver Monolithic (GDM) circuit or a Source Shared Driving (SSD) circuit. The second TFT 40 includes a gate electrode 42, a source electrode 43, and a drain electrode 44 in addition to the crystalline silicon semiconductor layer 41 described above.

In the present embodiment, the crystalline silicon semiconductor layer 41 is a polycrystalline silicon layer (for example, a Low-Temperature PolySilicon (LTPS) layer). In the illustrated example, a base coat layer (underlayer) 12 is provided on the substrate 1, and the crystalline silicon semiconductor layer 41 is provided on the base coat layer 12.

The gate electrode 42 is provided on the insulating layer 13 that covers the crystalline silicon semiconductor layer 41, and faces the crystalline silicon semiconductor layer 41 with the insulating layer 13 interposed therebetween. The gate electrode 42 is formed in the same layer as that of the lower gate electrode 2 of the first TFT 10 (that is, by patterning an identical conductive film). The insulating layer 13 is formed from an inorganic insulating material similar to that of the lower gate insulating layer 3.

The source electrode 43 and the drain electrode 44 are formed in the same layer as that of the source electrode 7 of the first TFT 10 (that is, by patterning an identical conductive film). Thus, the source electrode 34 and the drain electrode 44 are provided on the first interlayer insulating layer 8. The source electrode 43 and the drain electrode 44 are connected to the crystalline silicon semiconductor layer 41 in the source contact hole $CH_S'$ and the drain contact hole $CH_D'$ that are formed in the first interlayer insulating layer 8, the lower gate insulating layer 3, and the insulating layer 13.

As described above, the second TFT 40 has a top gate structure. The channel region of the crystalline silicon semiconductor layer 41 of the second TFT 40 (the region facing the gate electrode 42) is light-blocked by the light blocking layer 11 formed under the base coat layer 12.

As in the present embodiment, by using an oxide semiconductor TFT having an excellent off-leak characteristic as the pixel TFT 10, and using a crystalline silicon TFT having excellent mobility as the circuit TFT 40, the drive capability can be improved while the power consumption is reduced. As exemplified, the gate electrode 42 of the circuit TFT 40 is formed in the same layer as that of the lower gate electrode 2 of the pixel TFT 10, which allows an increase in the manufacturing process to be suppressed.

Oxide Semiconductor

An oxide semiconductor included in the oxide semiconductor layer 4 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer 4 may have a layered structure including two or more layers. The oxide semiconductor layer 4 having the layered structure may include an amorphous oxide semiconductor layer and a crystalline oxide semiconductor layer, and may include a plurality of crystalline oxide semiconductor layers having different crystal structures. Additionally, the oxide semiconductor layer 4 having the layered structure may include a plurality of amorphous oxide semiconductor layers. When the oxide semiconductor layer 4 has the layered structure, the energy gaps among the layers may be different from each other.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents described in JP 2014-007399 A are incorporated herein by reference.

The oxide semiconductor layer 4 may include, for example, at least one metal element selected from In, Ga, and Zn. In the embodiment described above, the oxide semiconductor layer 4 includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. Such an oxide semiconductor layer 4 can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which the c-axis is oriented substantially perpendicular to a layer surface is preferable as the crystalline In—Ga—Zn—O based semiconductor.

Note that the crystal structure of the crystalline In—Ga—Zn—O based semiconductor is described in, for example, JP 2014-007399 A, JP 2012-134475 A, and JP 2014-209727 A described above. The entire contents described in JP 2012-134475 A and JP 2014-209727 A are incorporated herein by reference. A TFT including an In—Ga—Zn—O based semiconductor layer has high mobility (more than 20 times as compared to an a-Si TFT) and low leakage current (less than 1/100 as compared to an a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 4 may include another oxide semiconductor. For example, the oxide semiconductor layer 4 may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer 4 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

Liquid Crystal Display Device

The active matrix substrates 100, 200, 300, 400 and 500 according to the embodiments of the disclosure can be suitably used for a liquid crystal display device. An example of the liquid crystal display device is illustrated in FIG. 20.

Figure 20:
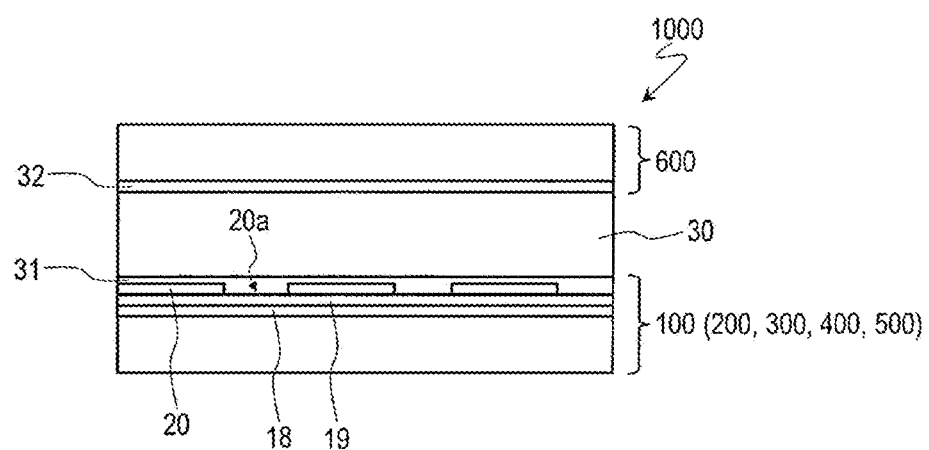
FIG. 20 is a cross-sectional view schematically illustrating a liquid crystal display device 1000 including the active matrix substrate 100 (200, 300, 400, 500) according to an embodiment of the disclosure.

The liquid crystal display device 1000 illustrated in FIG. 20 includes the active matrix substrate 100 (or the active matrix substrates 200, 300, 400, and 500), a counter substrate 600 provided so as to face the active matrix substrate 100, and the liquid crystal layer 30 provided between the active matrix substrate 100 and the counter substrate 600.

The active matrix substrate 100 includes the TFT 10 (not illustrated here) disposed in each pixel region P, the pixel electrode 18 electrically connected to the TFT 10, a dielectric layer 19 provided so as to cover the pixel electrode 18, and a common electrode 20 that is provided on the dielectric layer 19 and that faces the pixel electrode 18. At least one slit 20a is formed for each pixel region P in the common electrode 20.

Alignment films 31 and 32 are provided respectively on outermost surfaces of the active matrix substrate 100 and the counter substrate 600 at the liquid crystal layer 30 side. The counter substrate 600 includes a color filter layer and a black matrix (both not illustrated).

A thickness (cell gap) of the liquid crystal layer 30 is defined by the columnar spacer 50 (not illustrated in FIG. 20) provided at the liquid crystal layer 30 side of the counter substrate 600. The spacer receiving portion 17' as illustrated in FIG. 13 may be provided at the active matrix substrate side.

Note that, although an FFS mode, which is a type of transverse electrical field mode, liquid crystal display device 1000 is exemplified here, the active matrix substrate according to the embodiment of the disclosure may be used for liquid crystal display devices of other display modes. In a liquid crystal display device of a vertical electrical field mode such as a Twisted Nematic (TN) mode or a Vertical Alignment (VA) mode, a common electrode is provided at a counter substrate side.

INDUSTRIAL APPLICABILITY

According to the embodiments of the disclosure, it is possible to provide an active matrix substrate in which a decrease in transmittance caused by a contact hole formed in a flattened layer is suppressed. The active matrix substrate according to the embodiments of the disclosure is suitably used in a high-resolution (for example, 1000 ppi or greater) liquid crystal display device such as a liquid crystal display device for a head-mounted display.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate provided with a display region defined by a plurality of pixel regions, the active matrix substrate comprising:
   a substrate;
   a transistor supported by the substrate and disposed on each of the plurality of pixel regions, the transistor including
      an oxide semiconductor layer provided on the substrate, the oxide semiconductor layer including a channel region, a source contact region, and a drain contact region, the source contact region and the drain contact region positioned, respectively, at any one side of the channel region, a gate insulating layer provided on the channel region, and a gate electrode provided on the gate insulating layer and formed by a gate metal layer, the gate electrode facing the channel region with the gate insulating layer interposed between the channel region and the gate electrode;

an interlayer insulation layer covering the transistor, the interlayer insulation layer having a first contact hole located on the drain contact region;

a transparent connection electrode provided on the interlayer insulation layer and electrically connected to the drain contact region via the first contact hole, the transparent connection electrode including a first portion extending from the first contact hole to right above the gate metal layer, and a second portion extending opposite to the first portion;

an organic insulating layer covering the transistor and the transparent connection electrode, and having a second contact hole located on the first portion, a bottom of the second contact hole overlapping the gate metal layer when viewed from a normal direction of the substrate, a side surface of the second contact hole having a curved shape in a cross-sectional view; and a pixel electrode provided on the organic insulating layer and electrically connected to the first portion of the transparent connection electrode via the second contact hole, the pixel electrode extending from the second contact hole beyond an end edge of the second portion of the transparent connection electrode.

2. The active matrix substrate of claim 1, wherein an entirety of the bottom of the second contact hole overlaps the gate metal layer.

3. The active matrix substrate of claim 1, wherein the interlayer insulation layer includes a plurality of insulating layers.

* * * * *